US010264699B2

United States Patent
Grady et al.

(10) Patent No.: US 10,264,699 B2
(45) Date of Patent: Apr. 16, 2019

(54) ENCLOSURE WITH A SHELF

(71) Applicant: HEWLETT PACKARD ENTERPRISE DEVELOPMENT LP, Houston, TX (US)

(72) Inventors: John R. Grady, Houston, TX (US); George D. Megason, Houston, TX (US); Joseph Allen, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/772,292

(22) PCT Filed: Oct. 30, 2015

(86) PCT No.: PCT/US2015/058384
§ 371 (c)(1),
(2) Date: Apr. 30, 2018

(87) PCT Pub. No.: WO2017/074433
PCT Pub. Date: May 4, 2017

(65) Prior Publication Data
US 2018/0324971 A1    Nov. 8, 2018

(51) Int. Cl.
*H05K 7/14* (2006.01)
*G06F 1/18* (2006.01)

(52) U.S. Cl.
CPC .......... *H05K 7/1489* (2013.01); *G06F 1/181* (2013.01); *G06F 1/183* (2013.01)

(58) Field of Classification Search
CPC ........ H05K 7/1489; G06F 1/181; G06F 1/183
See application file for complete search history.

(56) References Cited

U.S. PATENT DOCUMENTS

| | | |
|---|---|---|
| 7,633,760 B2 | 12/2009 | Wu et al. |
| 7,930,812 B2 | 4/2011 | Curnalia et al. |
| 2003/0030988 A1 | 2/2003 | Garnett et al. |
| 2003/0052581 A1 | 3/2003 | Dobler et al. |
| 2003/0111436 A1 | 6/2003 | Basinger et al. |

(Continued)

FOREIGN PATENT DOCUMENTS

| | | |
|---|---|---|
| DE | 102013108217 B3 | 10/2014 |
| GB | 2378823 A | 2/2003 |
| WO | WO-2012083166 A2 | 6/2012 |

OTHER PUBLICATIONS

Hewlett-Packard Development Company, L.P., "HP ProLiant BL680c G7 Server Blade Installation Instructions," Part No. 613834-001, Oct. 2010, pp. 1-4, First Edition.

(Continued)

*Primary Examiner* — Nidhi Thaker
(74) *Attorney, Agent, or Firm* — International IP Law Group, PLLC (57) ABSTRACT

In one example, a shelf includes a shelf lock positioned within a spring retention pocket of the shelf. The shelf lock includes a main body that includes a spring retention slot to accommodate a spring and an opening to accommodate a pressure component. The shelf lock includes a retractable tab to be inserted into an enclosure to prevent movement of the shelf when mounted in the enclosure. The spring to exert an outward force to insert the retractable tab into the enclosure and the retractable tab to be retracted by an inward pressure.

13 Claims, 7 Drawing Sheets

(56) References Cited

U.S. PATENT DOCUMENTS

| | | | |
|---|---|---|---|
| 2004/0196727 A1 | 10/2004 | Garnett et al. | |
| 2012/0212905 A1 | 8/2012 | Furuta et al. | |
| 2013/0162131 A1* | 6/2013 | Zhou | G06F 1/183 312/304 |
| 2013/0278124 A1* | 10/2013 | Hu | A47B 96/025 312/333 |
| 2014/0043770 A1* | 2/2014 | Zhou | G06F 1/183 361/728 |
| 2014/0084764 A1* | 3/2014 | Doglio | H05K 7/1489 312/223.2 |

OTHER PUBLICATIONS

International Search Report and Written Opinion, International Application No. PCT/US2015/058384, dated Jul. 28, 2016, pp. 1-8, KIPO.

Racksolutions, "Tool-less Rack Shelf," 2015, pp. 1-2 (online), Retrieved from the Internet on Aug. 19, 2015 at URL: <racksolutions.com/tool-less-rack-shelf.html>.

* cited by examiner

ENCLOSURE WITH A SHELF

A computing enclosure is a physical structure used to house computing devices and provide services such as power, cooling, and networking. The mounting of multiple servers in an enclosure can provide an organized arrangement to improve access to the servers and conserve space to mount additional computing devices. Accordingly, a computing enclosure can provide a centralized location for multiple computing devices in an effort to increase equipment integration and optimization of operating conditions.

DESCRIPTION OF THE DRAWINGS

The advantages of the present techniques are better understood by referring to the following detailed description and the attached drawings, in which.

DETAILED DESCRIPTION

A computing system stored in an enclosure includes various components, such as servers, modems, routers, power sources, and the like. Since system components may be gradually added over a period of time, the layout of the components may eventually hinder the availability of space for mounting new components or provide an unorganized computing space, among other issues. On the other hand, a compact and organized layout of components may provide space for adding equipment to enhance the efficiency and utilization of the computing system. For instance, heat emitted by heat-generating equipment may be removed from the enclosure by mounting additional cooling devices.

Removable shelving may expand the amount of space in the enclosure for additional components. For example, removable shelving can lift smaller-sized components into unused overhead spacing of an enclosure. This configuration may create additional spacing below the smaller components for the mounting of additional computing equipment. Additionally, shelving may provide enhanced access to maintain and service the components disposed in the enclosure, among other advantages. However, typical shelves may lack user-friendly design features. For instance, a manual lock may be used to secure a shelf into the enclosure. In the event that a user fails to manually lock the shelf in place, it may be accidently displaced and the components disposed on the shelf may be damaged or rendered unusable.

In the present examples, a removable shelf is configured to be installed using fewer steps to provide a more user-friendly experience. The sides of the removable shelf may be designed to be mounted on rails and slots located on sidewalls of an enclosure. In some instances, retaining features of the enclosure located on its sidewalls may be configured to engage with retaining features of the shelf. Further, a spring-loaded locking mechanism may automatically secure the shelf lock when fully inserted into the enclosure. Such features may hinder or prevent excessive movement of the shelf during and after its installation. Accordingly, the use of the present removable shelf may reduce or eliminate damage to a computing device located on the shelf or to a communication plane of the enclosure.

Figure 1A:
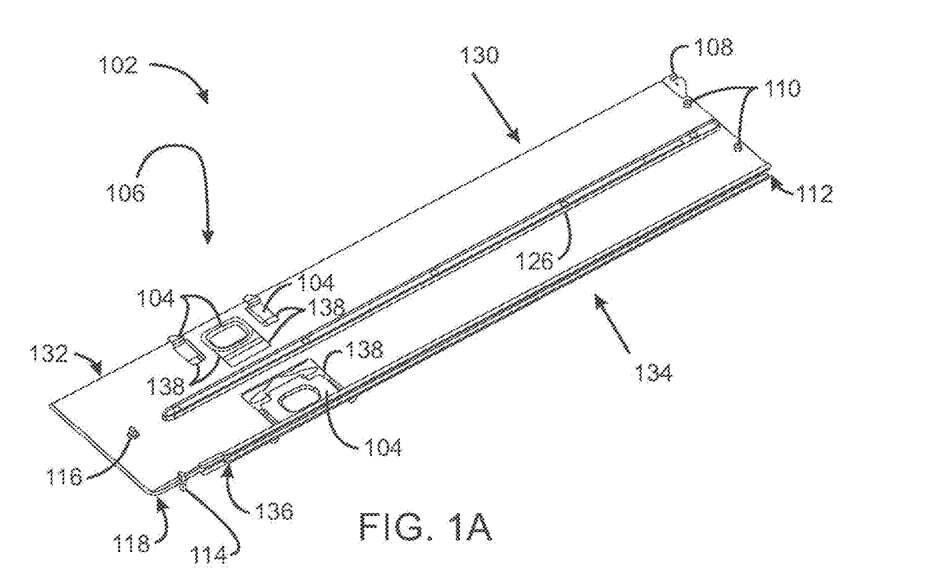
FIG. 1A is an example of a top perspective view of a shelf including an shelf lock.
Figure 1B:
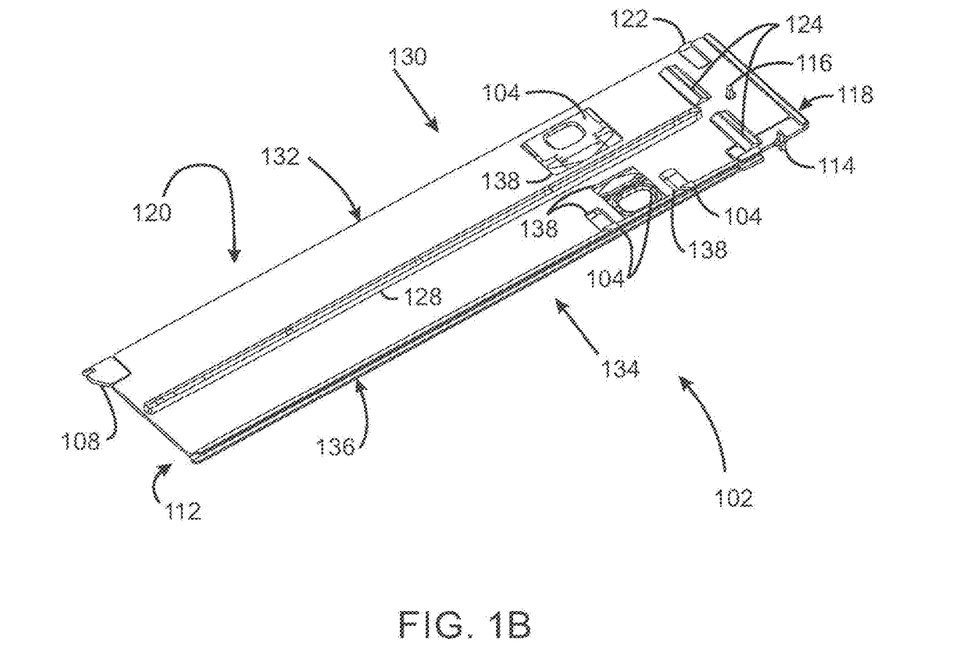
FIG. 1B is an example of a bottom perspective view of the shelf including the shelf lock.

FIG. 1A and FIG. 1B illustrate a top perspective view and a bottom perspective view, respectively, of a shelf 102 including a shelf lock 104. As shown in FIG. 1A, a top surface 106 of the shelf 102 may include several attached parts including a rear shelf catch 108 and a blade key 110 located at a rear end 112 of the shelf 102. Likewise, a reaction member shelf catch 114, a dual reaction member 116, and the shelf lock 104 may be located at a front end 118 of the shelf 102. In addition to the components located on the top surface 106, a bottom surface 120 of the shelf 102 may include a front shelf catch 122 and an EMI gasket 124, as shown in FIG. 1B.

The rear shelf catch 108, the front shelf catch 122, and the reaction member shelf catch 114 may engage with components of an external device to secure the shelf 102 during placement. Additionally, the reaction member shelf catch 114 and the dual reaction member 116 may assist other component devices mounted adjacent to the shelf 102. The blade key 110 may prevent damage to an external device to house the shelf 102 and to devices to be received by the shelf 102. In some examples, the EMI gasket 124 may provide a seal between the shelf 102 and, for example, an adjacent mating surface.

In examples, the top surface 106 may include an attached top divider 126 and the bottom surface 120 may include an attached bottom divider 128. A first side 130 of the shelf 102 may include a straight edge 132 and a second side 134 of the shelf 102 may include a "C" shaped channel 136. The straight edge 132 and the "C" shaped channel 136 may guide and align the shelf 102 during its placement. The dividers 126, 128 may guide and align other component devices during their placement in a location adjacent to the shelf 102.

A number of holes may be formed in the shelf 102 to provide openings 138 for various components to be disposed in the shelf 102. The dimensions of the openings 138 may be sized based on design specifications. As shown in FIGS. 1A and 1B, the openings 138 may receive one or more shelf locks 104 of an identical type. In other examples, the type of shelf locks 104 disposed in the opening 138 may vary.

The shelf lock 104 may be located along the length of the shelf 102 and at a distance from the front end 118 to allow spacing for components, such as the EMI gasket 124 and the front shelf catch 122 located on the bottom surface 120 of the shelf 102, as shown in FIG. 1B. The shelf lock 104 may include a spring-loaded locking mechanism to secure the placement of the shelf 102, for example, in an enclosure. In other examples, the shelf lock 104 may embody different types of locking mechanisms that can automatically secure and inhibit excessive movement of the shelf 102. Additionally, the location, the orientation, and the number of shelf locks 104, among other parameters, may vary based on enabling requirements. For example, additional shelf locks 104 may be disposed in additional openings to support the weight of a device placed upon the shelf 102 or to provide easy access for maintenance.

Figure 2A:
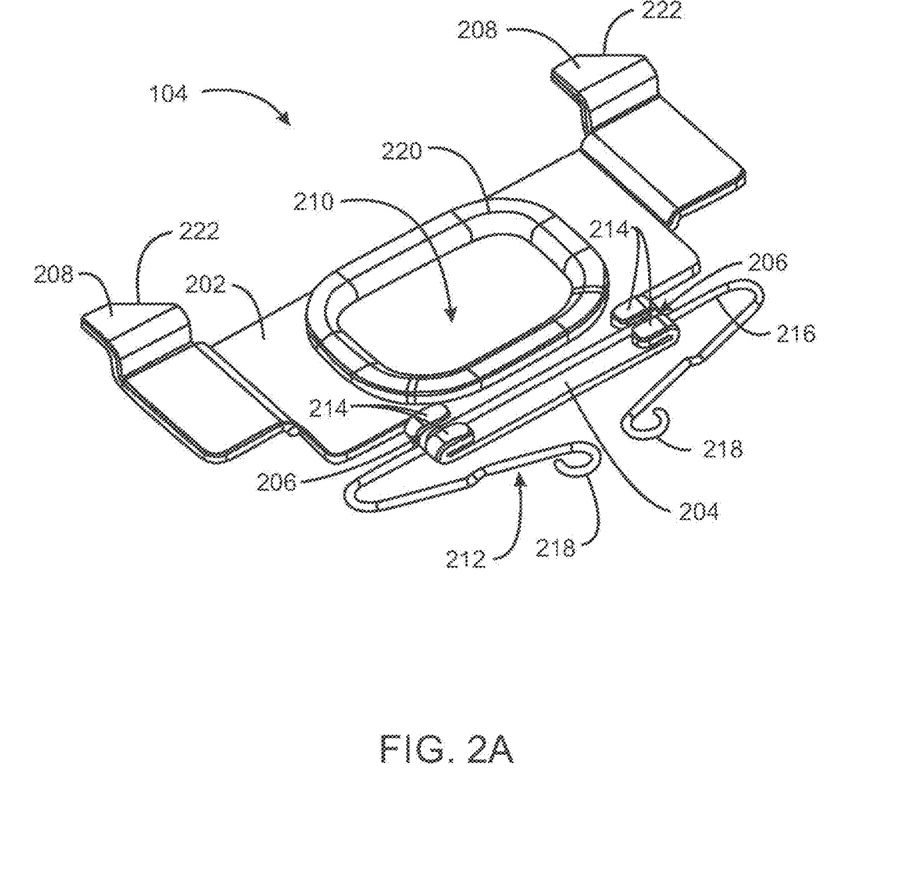
FIG. 2A is an example perspective view of the shelf lock.

FIG. 2A is a perspective view of the shelf lock 104. Like numbered items are as described with respect to FIGS. 1A and 1B. In the present examples, the shelf lock 104 may include a metal body 202, a spring retention 204, a spring retention slot 206, a retractable tab 208, a shelf lock opening 210, and a spring 212. The shelf lock opening 210 may be formed through the metal body 202 to receive a pressure force. The spring retention 204 may include bent ends 214 to form the spring retention slot 206. The spring retention slot 206 may trap and attach the spring 212 to the shelf lock 104 where a first end 216 of the spring 212 may be disposed between the bent ends 214. Accordingly, the spring retention 204 and its spring retention slot 206 may control the movement of the spring 212 during actuation of the shelf lock 104. A second end 218 of the spring 212 may be exposed and uninhibited, as shown in FIG. 2A. In other examples, different control techniques may secure the spring 212, or different types of spring component may be used, to provide stability and control.

The shelf lock opening 210 may be sized to receive a force from a pressure component, for example, a finger, a hand, or any component that can apply pressure to actuate the shelf lock 104 when disposed in the shelf 102. The shelf lock opening 210 may include a grip cover 220, as shown in FIG. 2A. The grip cover 220 may include metal or any other type a pliable material that can withstand pressure and provide ease of use.

The retractable tab 208 may extend outward from the metal body 202. In examples, a corner of the retractable tab 208 may include a slanted edge 222 to provide smooth and control movements of the shelf lock 104. Accordingly, the slanted edge 222 of the retractable tab 208 may enable the shelf lock 104 to glide against a surface, such as a sidewall of an enclosure, during its installation.

Figure 2B:
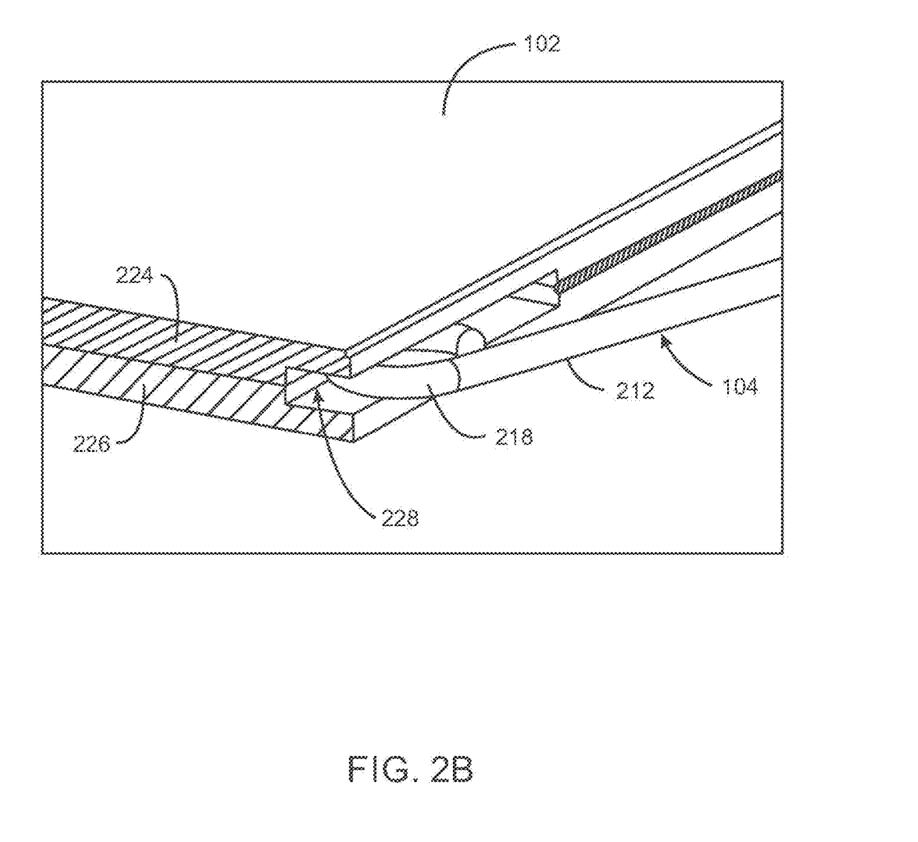
FIG. 2B is an example detailed perspective view of the shelf lock when inserted into the shelf.

FIG. 2B is a detailed perspective view of the shelf lock 104 when inserted into the shelf 102. Like numbered items are as described with respect to FIGS. 1A, 1B, and 2A. To form the shelf 102, thin sheets of metal, including a top metal sheet 224 and a bottom metal sheet 226, may be combined using a staking manufacturing technique or any other joining techniques. The thickness of each sheet of metal may include about 1.5 millimeters (mm) to provide a shelf 102 thickness of about 3.0 mm. In other examples, the shelf 102 may be formed using a single sheet of metal or an additional number of sheets of metal depending on manufacturing specifications.

The shelf lock 104 may be located between the top metal sheet 224 and the bottom metal sheet 226, where it may be securely contained between the sheets 224, 226 to prevent its displacement during actuation. In examples, the shelf 102 may include a spring retention pocket 228 that may house the second end 218 of the shelf lock 104 to maintain its position when subjected to movement or a force, for example, the pressure component.

Figure 3A:
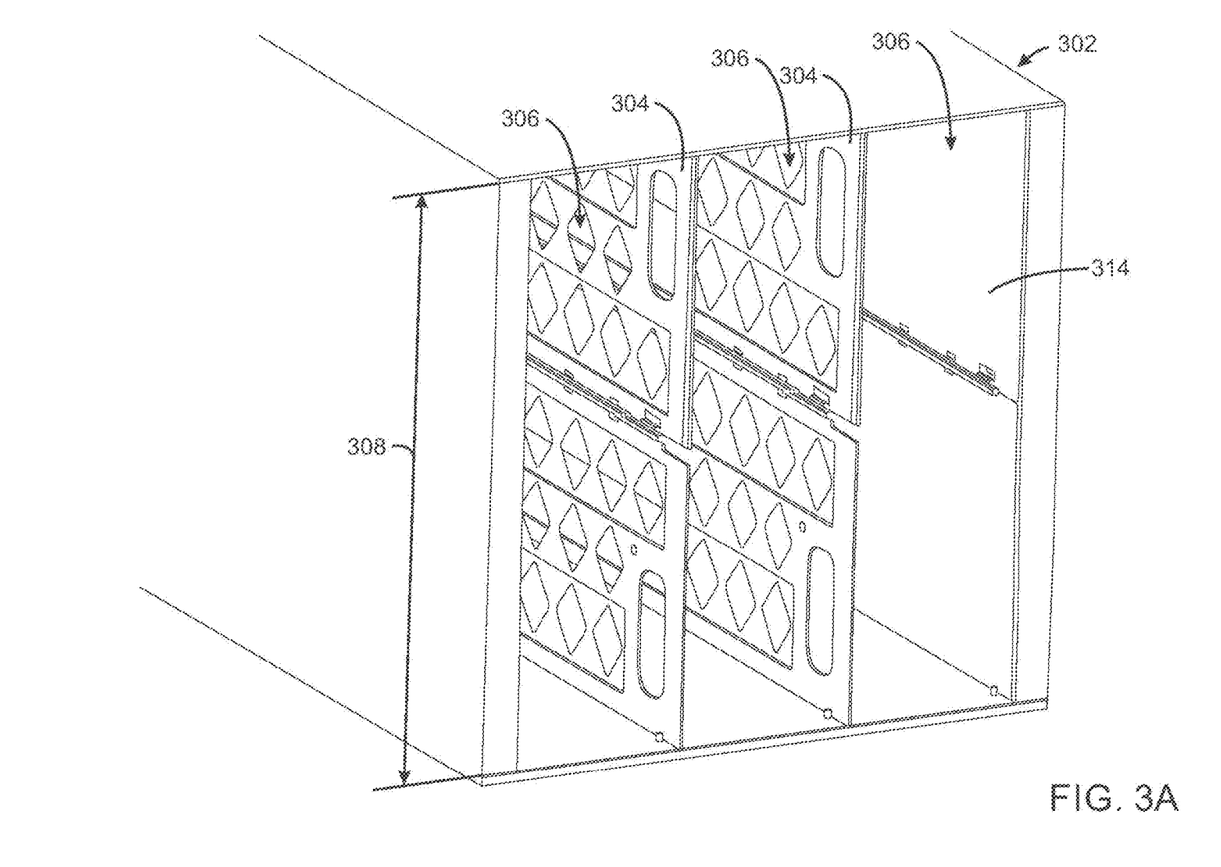
FIG. 3A is an example front perspective view an example enclosure.

FIG. 3A is a front perspective view an enclosure 302. The enclosure 302 may include a chassis that defines an internal volume where a vertical dividing wall 304 may be disposed in the internal volume to define a separate area, such as a bay 306. As shown in FIG. 3A, two vertical dividing walls 304 are disposed between sidewalls 314 of the enclosure 302 to form three separate bays 306. Each bay 306 in the enclosure 302 may house various components such as blades, power supplies, and input/output (I/O) devices, among others. In some examples, the bay 306 may be sized to accommodate full-height blades that can extend a vertical height 308 of the bay 306.

Figure 3B:
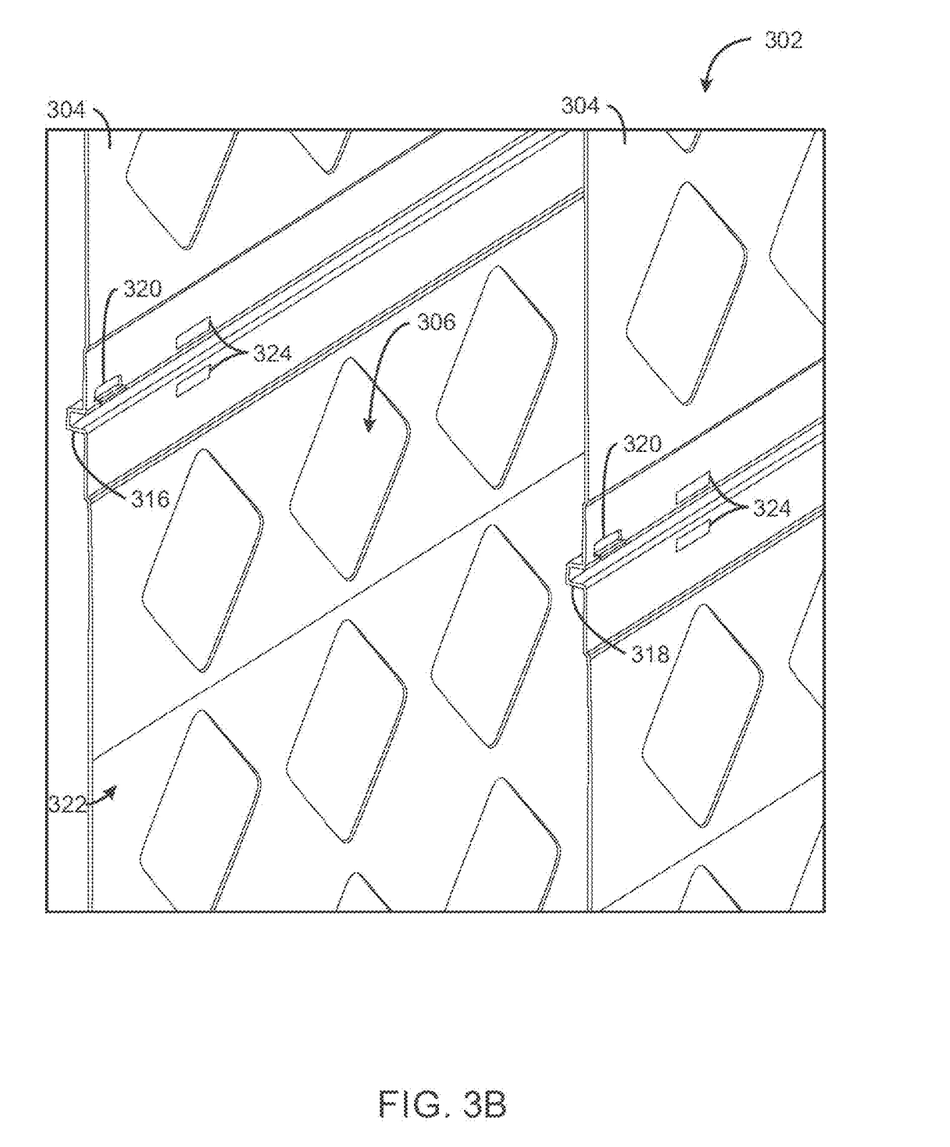
FIG. 3B is an example detailed front perspective view the example enclosure.

FIG. 3B is a detailed front perspective view the enclosure 302. Like numbered items are as described with respect to FIG. 3A. The vertical dividing wall 304 and side-wall 314 (not shown) of the enclosure 302 may include mounting features for receiving a component, for example, the shelf 102 of FIGS. 1A and 1B. In examples, the mounting features may include a slot 316 and a rail 318. Additionally, the enclosure 302 may include several retaining features to provide alignment and to act as guides during insertion and removal of a component. As shown in FIG. 3B, the vertical dividing wall 304 may include a front catch 320 and a rear catch (not shown). The front catch 320 may be located at a front enclosure side 322. The rear catch (not shown) may be located at a rear enclosure side (not shown). Additionally, each vertical dividing wall 304 may include shelf lock receptacles 324 along its horizontal length to hold the component in place when fully-inserted into the enclosure 302.

Figure 3C:
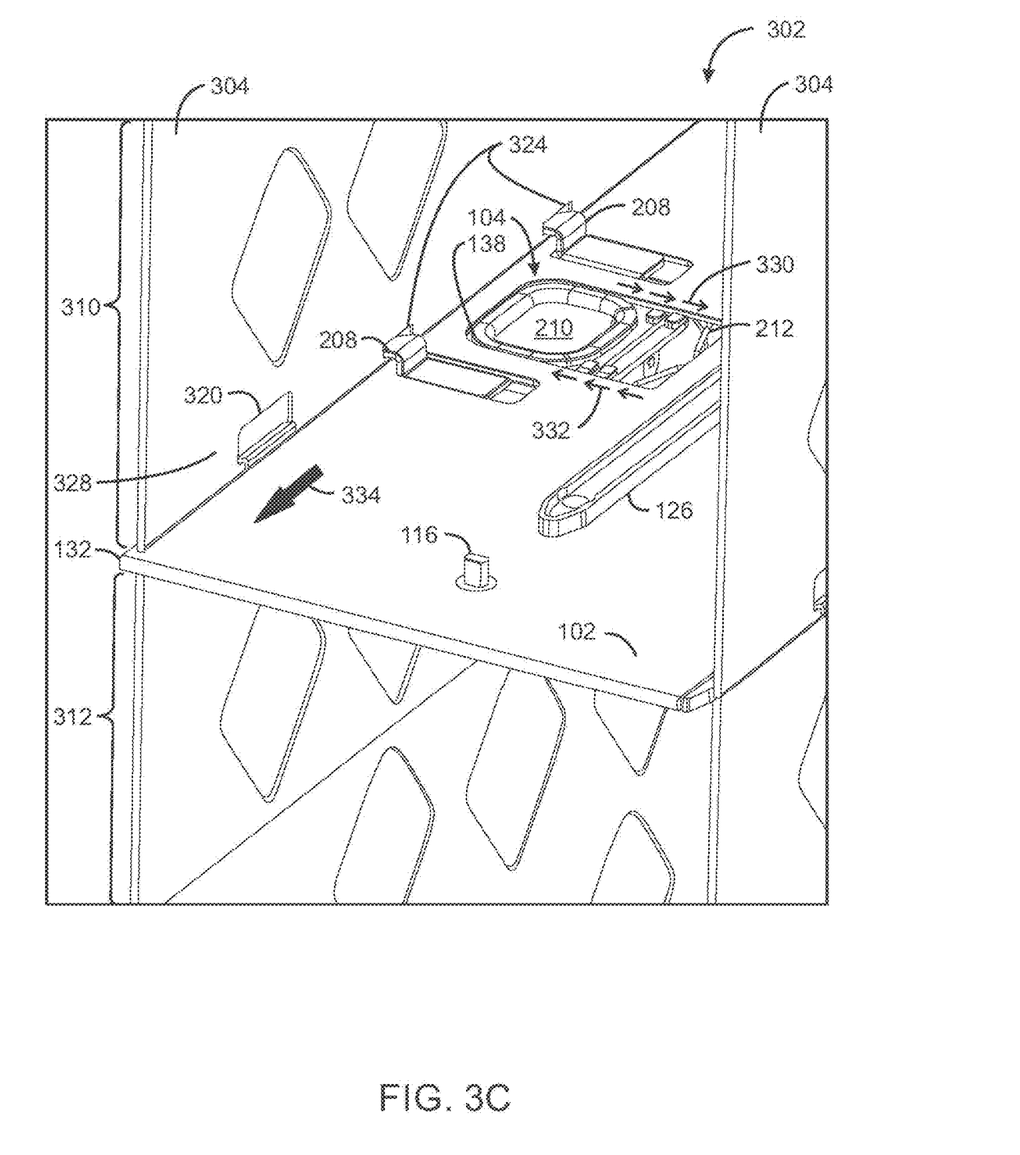
FIG. 3C is an example perspective view of the shelf when inserted into the enclosure.

FIG. 3C is a perspective view of the shelf 102 inserted into the enclosure 302. Like numbered are as described with respect to FIGS. 1A, 1B, 3A, and 3B. Insertion of the shelf 102 may configure the enclosure 302 to accommodate devices of different heights by partitioning the bay 306 of FIG. 3A into separate bay areas. As shown in FIG. 3C, the shelf 102 may divide the bay 306 into two individual bay areas, 310 and 312, to accommodate components of a height less than the vertical height 308, as shown in FIG. 3A, of the bay 306. For instance, the bays 310, 312 may accommodate quarter-height and half-height blades. In other examples, multiple shelves 102 may be located in the bay 306 to provide additional bay areas depending on the needs of a user.

To insert the shelf 102 into the enclosure 302, the straight edge 132 of the shelf 102 may align with the slot 316 and the "C" shaped channel 136 of the shelf 102 may straddle the rail 318 of the enclosure 302. With the shelf 102 aligned using such retaining features, a user may slide the shelf 102 into the enclosure 302.

When the shelf lock 104 reaches the vertical dividing wall 304 during insertion, the wall 304 exerts a force on the shelf lock. Specifically, the slanted edge 222 (not shown) of the retractable tab 208 may slide along a side surface 328 of the vertical dividing wall 304 where the wall 304 may force the shelf lock 104 to move towards a central area of the shelf 102, as shown by inward arrows 330. When the shelf lock 104 reaches the shelf lock receptacle 324, the spring 212 may force the retractable tab 208 into the receptacle 324. In this manner, the shelf lock 104 may actuate in an outward direction, as shown by outward arrows 322. Accordingly, the shelf 102 may be locked into the enclosure 302 to inhibit or prevent its movement. In examples, the spring 212 may exert a spring-loaded action to actuate the shelf lock 104 and thus, exclude the need to manually lock the shelf 102 within the enclosure 302.

To remove the shelf 102, a pressure component, such as a hand, grip the shelf lock 104 in the shelf lock opening 210. An inward pressure, such as a squeeze by the hand, may force the shelf lock 104 towards the central area of the shelf 102, as shown by the inward arrows 330, to force the retractable tab 208 to withdraw from the shelf receptacle 324 so as to fully expose the tab 208. The removal of the retractable tab 208 from the shelf receptacle 324 may unlock and release the shelf 102 from the enclosure 302. Once released, the user may pull the shelf 102 out of the enclosure 302, as shown by an outward arrow 334.

Figure 4:
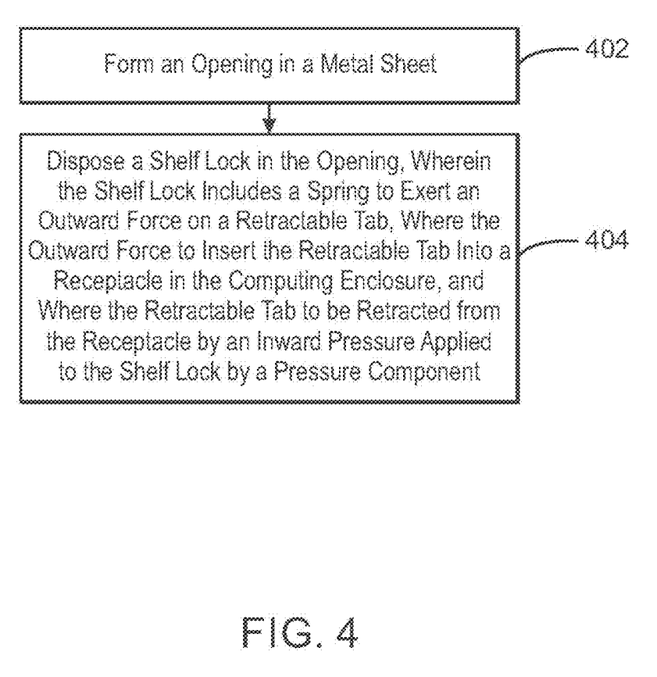
FIG. 4 is an example method of manufacturing the shelf.

FIG. 4 is a method of manufacturing the shelf for a computing enclosure. Thin sheets of metal, including a top metal sheet and a bottom metal sheet, may be joined together to form the shelf. The thickness of each sheet of metal may include about 1.5 millimeters (mm) to provide a shelf thickness of about 3.0 mm. Accordingly, the shelf may occupy less space in the computing enclosure for the mounting of computing components. At block 402, an opening may be formed in the shelf, where in examples, several openings may be formed in the shelf. At block 404, a shelf lock may be disposed in the opening. In particular, a retractable tab, as a component part of the shelf lock, may be disposed in an opening to secure the shelf within the computing enclosure. The shelf lock may include a spring used to exert an outward force on the shelf lock, including its retractable tab. For example, the shelf may reach a point during insertion where the retractable tab may be subjected to an outward force via the spring. Due to the outward force, the retractable tab can be inserted into openings in the computing enclosure, such as receptacles. The retractable tab within the receptacles may lock the shelf into the computing enclosure to prevent movement of the shelf. To remove, the shelf from the computing enclosure, an inward pressure may be applied to force movement of the shelf lock in an inward direction and towards a center area of the shelf. Once the pressure is applied, the retractable tab may withdraw from the receptacle to unlock the shelf from within the computing enclosure. In this way, a user may slide the shelf out of the computing enclosure.

While the present techniques may be susceptible to various modifications and alternative forms, the embodiments discussed above have been shown only by way of example. However, it should again be understood that the techniques is not intended to be limited to the particular embodiments disclosed herein. Indeed, the present techniques include all alternatives, modifications, and equivalents falling within the true spirit and scope of the appended claims.

What is claimed is:

1. A shelf to be received in a computing enclosure and to receive a computing device, the shelf comprising: a spring retention pocket formed in the shelf; and a shelf lock positioned within the spring retention pocket, the shelf lock comprising: a main body comprising a spring retention slot and an opening to accommodate a pressure component; a spring positioned within the spring retention slot; and a retractable tab inserted into the computing enclosure to prevent movement of the shelf; wherein the spring exerts an outward force to insert the retractable tab into the computing enclosure; and wherein the retractable tab is to be retracted from the computing enclosure by an inward pressure.

2. The shelf of claim 1, wherein the computing enclosure comprises a front shelf catch and a rear shelf catch to secure the shelf when inserted into the computing enclosure.

3. The shelf of claim 1, wherein the spring is spring-loaded to exert a compression force or a spring force.

4. The shelf of claim 1, wherein the shelf lock is to automatically secure the shelf within the computing enclosure, wherein the spring of the shelf lock is spring-loaded.

5. The shelf of claim 1, wherein the inward pressure comprises a finger, a hand, or a pressure component to actuate the shelf lock towards a central area of the shelf.

6. The shelf of claim 1, wherein a side surface of the shelf comprises a "C" shaped channel to mate with a side surface of the computing enclosure.

7. An enclosure, comprising:
a slot located on a first vertical wall of the enclosure;
a rail located on a second vertical wall of the enclosure, wherein the first vertical wall and the second vertical wall face each other;
a shelf lock receptacle located on the first vertical wall and the second vertical wall;
a shelf to be inserted into the enclosure, the shelf comprising:
a spring retention pocket formed in the shelf; and
a shelf lock positioned within the spring retention pocket, the shelf lock comprising:
a main body comprising a spring retention slot and an opening to accommodate a pressure component;
a spring positioned within the spring retention slot; and
a retractable tab inserted into the enclosure, wherein the spring exerts an outward force to insert the retractable tab into the enclosure, and wherein the retractable tab is to be retracted from the enclosure by an inward pressure.

8. The enclosure of claim 7, wherein the shelf lock is to automatically secure the shelf within the enclosure, wherein the spring of the shelf lock is to be spring-loaded.

9. The enclosure of claim 7, wherein the retractable tab is to be inserted into the shelf lock receptacle to secure the shelf within the computing enclosure.

10. The enclosure of claim 7, wherein the slot engages with a first side edge of the shelf and the rail engages with a second side edge of the shelf to align the shelf during insertion.

11. A method of manufacturing a shelf, comprising: joining a top metal sheet and a bottom metal sheet to form the shelf, forming an opening in the shelf; disposing a shelf lock in the opening, wherein the shelf lock comprises a spring; positioning the spring between the top metal sheet and the bottom metal sheet to inhibit movement of the spring, wherein the spring exerts an outward force on a retractable tab, wherein the outward force is to insert the retractable tab into a receptacle in the computing enclosure, wherein the retractable tab is to be retracted from the receptacle by an inward pressure applied to the shelf lock by a pressure component, and wherein the shelf is to be inserted in a computing enclosure.

12. The method of claim 11, wherein the retractable tab comprises a slant end to glide the shelf during insertion into the computing enclosure.

13. The method of claim 11, comprising disposing an end of the spring into a spring retention slot of the shelf lock to secure the spring, wherein the spring is spring-loaded.

* * * * *